United States Patent [19]

Shigehara et al.

[11] Patent Number: 5,214,611

[45] Date of Patent: May 25, 1993

[54] MEMORY ACCESS DEVICE FOR ACCESSING MEMORY CELL ARRAY DIAGONALLY

[75] Inventors: Hiroshi Shigehara; Toshimasa Kawaai, both of Tokyo, Japan

[73] Assignee: Kabushiki Kaisha Toshiba, Kawasaki, Japan

[21] Appl. No.: 682,241

[22] Filed: Apr. 9, 1991

[30] Foreign Application Priority Data

Apr. 11, 1990 [JP] Japan ................................ 2-95275

[51] Int. Cl.⁵ ............................................. G11C 8/00
[52] U.S. Cl. ................................... 365/236; 365/233; 365/230.09
[58] Field of Search ................... 365/236, 233, 230.09, 365/239, 240, 230.01

[56] References Cited

U.S. PATENT DOCUMENTS

| | | | |
|---|---|---|---|
| 4,747,080 | 5/1988 | Yamada | 365/200 |
| 5,105,425 | 4/1992 | Brewer | 365/201 |
| 5,111,434 | 5/1992 | Cho | 365/230.09 |

*Primary Examiner*—William L. Sikes
*Assistant Examiner*—Toan Tran
*Attorney, Agent, or Firm*—Finnegan, Henderson, Farabow, Garrett & Dunner

[57] ABSTRACT

A memory cell array stores data in its row and column directions. A counter counts clock signal pulses, represents the counted value by using binary system, and outputs, as the column address, values occupying predetermined lower bit positions, while supplying values occupying predetermined upper and lower bit positions into an adder circuit. The adder circuit processes the values supplied, and outputs, as the row address, the values thus processed, so that the memory cell array is accessed diagonally.

12 Claims, 5 Drawing Sheets

| ROW \ COLUMN | (UPPER 2BIT) — (LOWER 2BIT) | | | |
|---|---|---|---|---|
| | 0 0 | 0 1 | 1 0 | 1 1 |
| 0 0 0 | 0 0 | 0 1 | 1 0 | 1 1 |
| 0 0 1 | 1 1 | 0 0 | 0 1 | 1 0 |
| 0 1 0 | 1 0 | 1 1 | 0 0 | 0 1 |
| 0 1 1 | 0 1 | 1 0 | 1 1 | 0 0 |
| 1 0 0 | 0 0 | 0 1 | 1 0 | 1 1 |
| 1 0 1 | 1 1 | 0 0 | 0 1 | 1 0 |
| 1 1 0 | 1 0 | 1 1 | 0 0 | 0 1 |
| 1 1 1 | 0 1 | 1 0 | 1 1 | 0 0 |

MEMORY ACCESS DEVICE FOR ACCESSING MEMORY CELL ARRAY DIAGONALLY

BACKGROUND OF THE INVENTION

1. Field of the Invention

This invention relates to a memory access device for use in a voice synthesizing apparatus, an image processing apparatus, and the like.

2. Description of the Related Art

FIG. 10 shows the address map of, for example, a 32-bit memory cell array 51. Each cell of the array has row and column addresses. In this memory 51, the cells of any row-selected are successively accessed by designating the column addresses of the cells one after another, or the cell of any column selected are successively accessed by designating the row address of the cells one after another.

In this access method, if the memory 51 has defective cells, as is indicated by the hatching in FIG. 10, defective data will be read out from the memory 51 when the row or column address of any of the defective cells is selected. If, for example, each cell column consists of 1024 cells, at most 1024 defective data items may be read out successively. In view of this, the memory 51 can hardly be used in combination with a voice recording/reproducing circuit or an image processing circuit which has an ADM (Adaptive Delta Modulation) system and which therefore can operate in a comparatively reliable manner against defective data.

In order not to read defective data from the memory 51 by the conventional access method, redundancy technique must be applied to the memory 51. In other words, the memory must be equipped with spare memory cells to be designated by spare row and column addresses and elements associated with the spare cells. Defective memory cells, if exist, are replaced with the spare cells. This redundancy technique inevitably results in a large number of circuit elements, and hence a high manufacturing cost of the memory.

SUMMARY OF THE INVENTION

It is the object of the invention to provide a memory access device which enables a memory having defective cells to be used in a system which can operate in a comparatively reliable manner against defective data, and therefore which enables even a cheap memory, having no spare memory cells and elements associated with the spare cells, to be used in the system.

To attain this object, the memory access device of the invention comprises:

a memory cell array for storing data, which has memory cells arranged in row and column directions; and address-creating means for successively creating row and column addresses of the memory cells to be accessed one after another, in response to clock signal pulses, so that the memory cell array is accessed diagonally.

By virtue of this structure, defective cells of the memory, if exist, are prevented from being accessed in succession, which enables the memory to be used without redundancy technique in a system which can operate in a comparatively reliable manner.

The memory cell array can be accessed diagonally, irrespective of the number of the cells arranged in the row or column direction, by using the address-creating means which may comprise the combination of a counter and an adder or the combination of a counter and a subtracter.

Further, the row and column addresses required for accessing the memory cell array diagonally can be created by counters or shift registers only (i.e. without an adder or a subtracter) in a case where the number of the cells of the cell row or column is odd.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

This invention will be explained in detail with reference to the accompanied drawings.

Figures 1, 2:
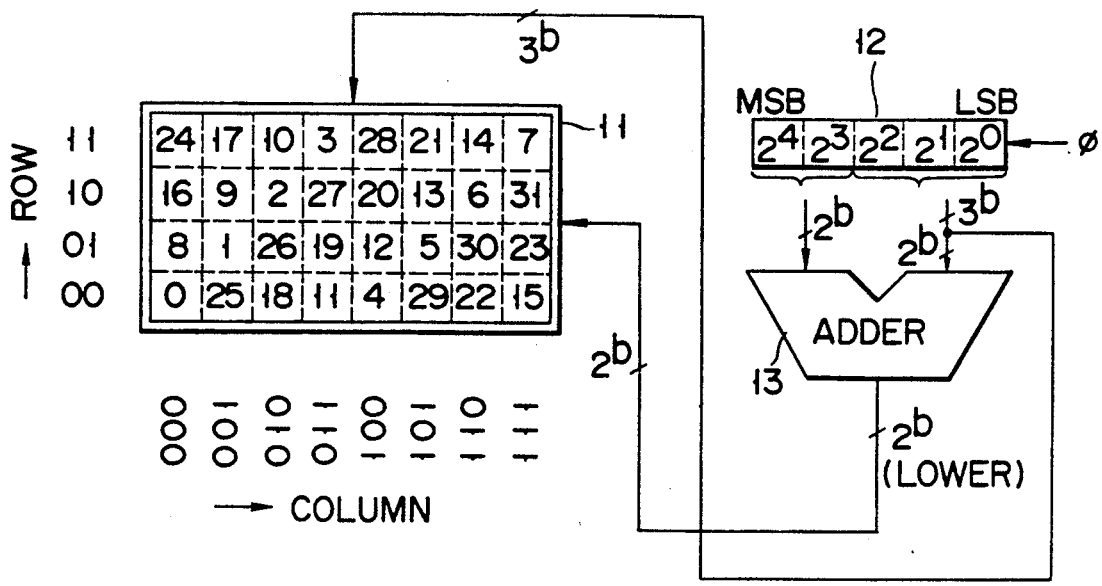
FIG. 1 is a diagram, showing a first embodiment of the invention.
FIG. 2 is a view, useful in explaining row and column addresses.

FIG. 1 shows a first embodiment of the invention. In the figure, a memory cell array 11 for storing data is e.g. 32 bits (4 bits in the row direction and 8 bits in the column direction).

An address counter 12 of 5 bits is provided for counting clock signal pulses $\phi$. The lower-three-bit results of the address counter 12 are used as the column address. The upper-two-bit results and the lower-two-bit results are supplied to an adder 13, where the row address is generated. Specifically, the results in the $2^4$-digit through $2^0$-digit positions of the address counter 12 are supplied to the adder 13, where the results in the $2^4$-bit and $2^1$-bit positions are added to each other, while the results in $2^3$-bit and $2^0$-bit positions are added to each other. The lower-two-bit results of the adder 13 are used as the row address of the memory cell array 11.

The column address output from the address counter 12 and the row address output from the adder 13 are supplied to the memory cell array 11 by way of a column decoder (not shown) and a row decoder (not shown), respectively.

The column and row addresses thus obtained by the counter 12 and adder 13 are shown in FIG. 2. If these column and row addresses are used, the cells of the memory cell array 11 are accessed diagonally in the order indicated by the numbers shown in FIG. 1. Hereinafter, this access is called "helical access".

Figure 3:
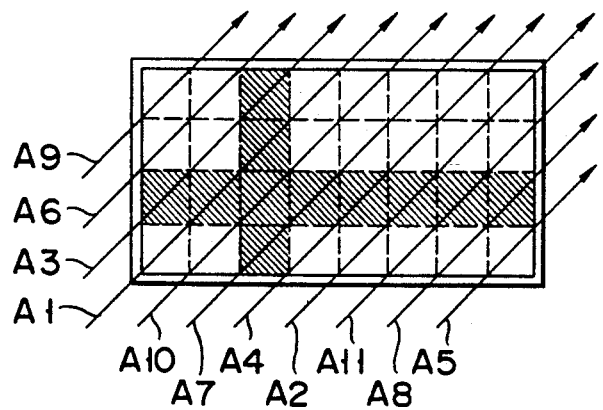
FIG. 3 is a view, useful in explaining the access made to a memory cell array in accordance with the addresses shown in FIG. 2.

FIG. 3 shows the helical access made to the memory cell array 11, in which reference numerals A1, A2, ... indicate the access order.

Where the helical access is carried out to write data and to read the data, even if there are some defective cells in the memory cell array 11, as is indicated by hatching in FIG. 3, these defective cells are prevented from being accessed successively. By virtue of this, even a memory cell array having some defective cells can be used in an apparatus incorporating an ADM system or the like which can operate in a comparatively reliable manner irrespective of defective data.

Further, the device according to the embodiment can use a memory cell array having some defective cells without redundancy technique, which reduces its manufacturing cost.

Figure 4:
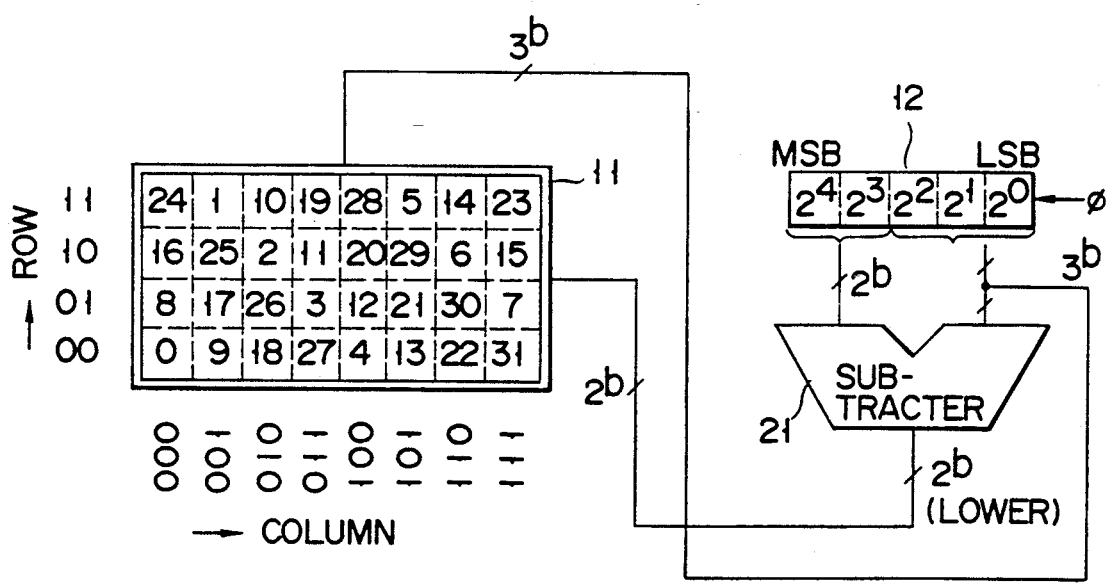
FIG. 4 is a view, showing a second embodiment of the invention.

FIG. 4 shows a second embodiment of the invention, in which like numerals denote like elements employed in the first embodiment. This embodiment differs from the first one in that the row address is obtained by a subtracter 21 instead of the adder 13.

Figures 5, 6:
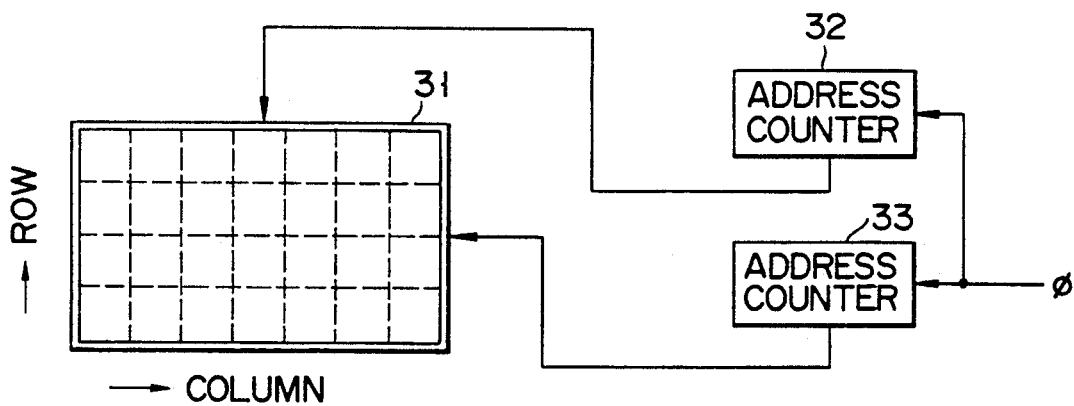
FIG. 5 is a view, useful in explaining row and column addresses.
FIG. 6 is a view, showing a third embodiment of the invention.
Figure 7A:
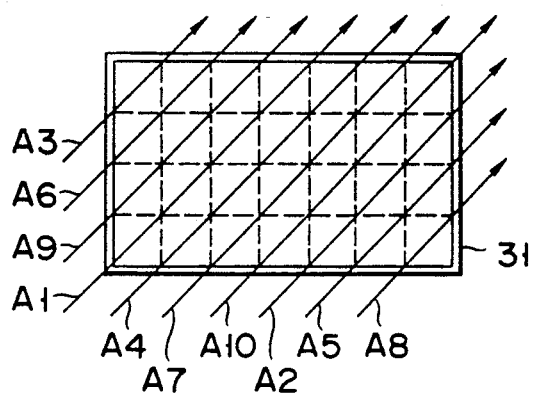
FIGS. 7A to 7D are views, showing helical access made in the third embodiment.
Figure 7B:
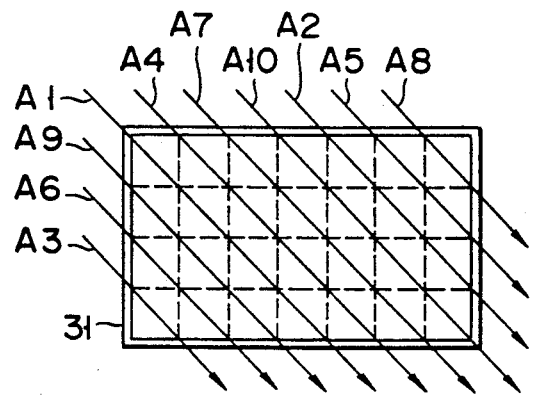
Figure 7C:
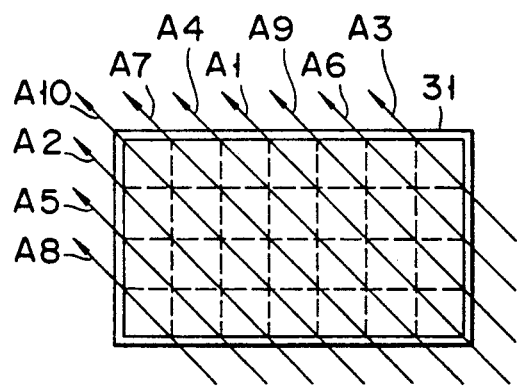
Figure 7D:
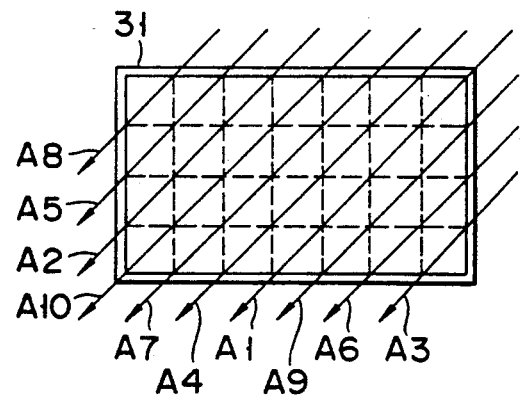

In the second embodiment, the address counter 12 counts clock signal pulses $\phi$, and the subtracter 21 carries out subtraction in a similar way to that of the adder 13, thereby obtaining the row and column addresses shown in FIG. 5. Where these addresses are used, helical access is made to the cells of the memory cell array 11 in the order indicated by the numbers shown in FIG. 4.

This embodiment can provide the same advantages as those of the first embodiment.

FIG. 6 shows a third embodiment. In the first and second embodiments, the number of the cells of the cell row and that of the cells of the cell column are both even. If one of the numbers is odd, the circuit can be made simple.

In the third embodiment, the number of the cells of the cell column is odd, e.g. 7, while the number of the cells of the cell row is even, e.g. 4. The row and column addresses of each cell of the array 31 are obtained by address counters 32 and 33 for counting clock signal pulses $\phi$. The counter 32 is of e.g. 3 bits, while the counter 33 is of e.g. 2 bits. These counters can comprise as follows:

|  | COUNTER 32 | COUNTER 33 |
| --- | --- | --- |
| a) | UP-COUNTER | UP-COUNTER |
| b) | UP-COUNTER | DOWN-COUNTER |
| C) | DOWN-COUNTER | UP-COUNTER |
| D) | DOWN-COUNTER | DOWN-COUNTER |

Helical access can be made to the memory cell array 31 by using the row and column addresses obtained by the above counters 32 and 33.

(a), (b), (c), and (d) of FIG. 7 show directions in which the array 31 is accessed by the use of the counters a), b), c), and d), respectively. A1, A2, ... indicate the order of access.

Figure 8:
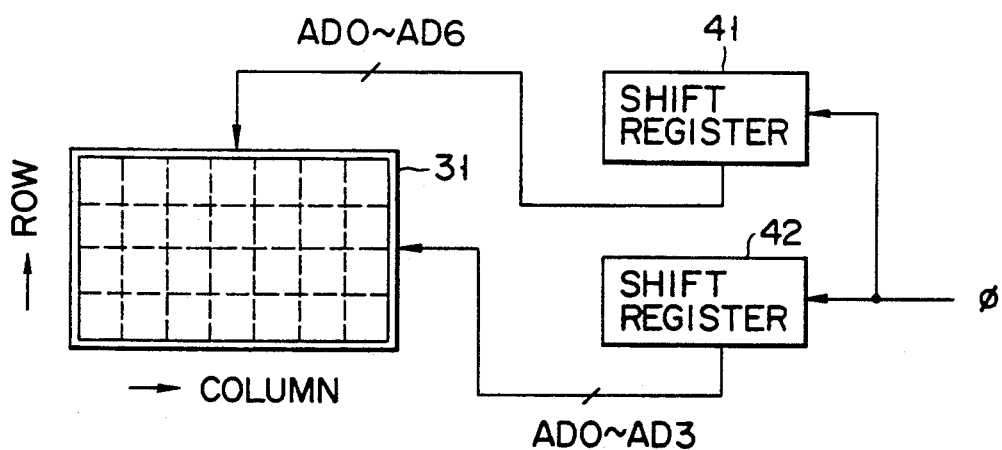
FIG. 8 is a view, showing a fourth embodiment of the invention.

FIG. 8 shows a fourth embodiment. This embodiment differs from the third one only in that shift registers 41 and 42 are incorporated instead of the address counters 32 and 33. The shift register 41 of 7 bits produces the column address, and the shift register 42 of 4 bits produces the row address.

Figure 9:
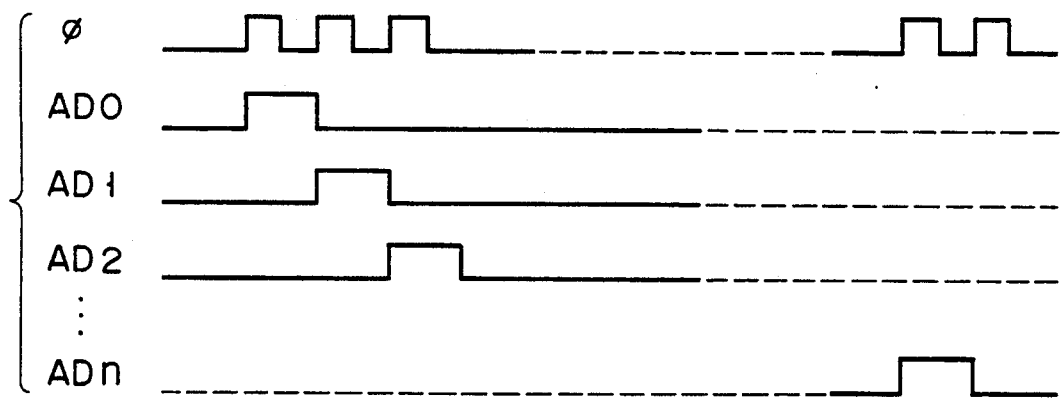
FIG. 9 is a timing chart, useful in explaining the access made in the fourth embodiment.
Figure 10:
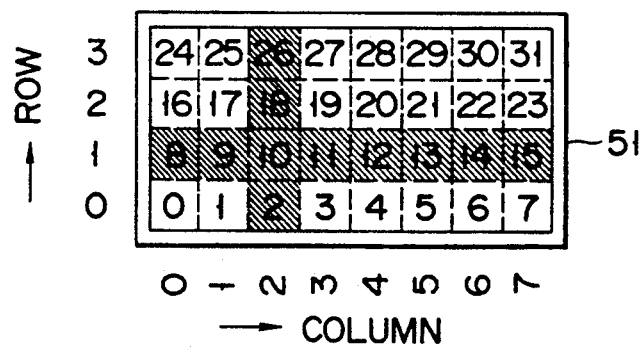
FIG. 10 is a view, useful in explaining a conventional memory access method.

As is shown in FIG. 9, the registers 41 and 42 output signals AD1-ADn. Helical access is made to the memory cell array 31 in accordance with the signals.

A counter which has an initial value being able or unable to be changed, such as has a setting switch, a resetting switch, setting and resetting switches, or a presetting switch, can be used as the address counter employed in the above-described embodiments. However, it is advantageous to use a counter which has a presetting switch being able to change the initial address for carrying out helical access. Further, any one of an up-counter, a down-counter, and an up-down-counter can be used.

Further, it is a matter of course to carry out various modifications without departing from the scope of the invention.

What is claimed is:

1. A memory access device comprising:

a memory cell array for storing data, which has memory cells arranged in row and column directions; and address-creating means connected to the memory cell array for successively creating row and column addresses of the memory cells to be accessed one after another, in response to clock signal pulses, and for sequentially diagonally accessing the memory cell array.

2. The device according to claim 1, wherein the address-creating means comprises:

an adder circuit; and a counter for counting the clock signal pulses, representing the counted value by using binary system, and outputting, as the column address, values occupying predetermined bit positions, while supplying values occupying predetermined bit positions into the adder circuit;

the adder circuit processing the values supplied, and outputting, as the row address, the values thus processed.

3. The device according to claim 1, wherein the address-creating means comprises:

a subtracter circuit; and a counter for counting the clock signal pulses, representing the counted value by using binary system, and outputting as the column address, values occupying predetermined bit positions, while supplying values occupying predetermined bit positions into the subtracter circuit;

the subtracter circuit processing the values supplied, and outputting, as the row address, the values thus processed.

4. A memory access device comprising:

a memory cell array for storing data, which has memory cells arranged in row and column directions;

an arithmetic circuit connected to the memory cell array; and a counter connected to the memory cell array for counting clock signal pulses, representing the counted value by using binary system, and outputting, as the column address, values occupying predetermined bit positions, while supplying values occupying predetermined bit positions into the arithmetic circuit;

the arithmetic circuit processing the values supplied, and outputting as the row address the values thus processed, so that the memory cell array is accessed sequentially diagonally.

5. The device according to claim 4, wherein the arithmetic circuit comprises a subtracter.

6. The device according to claim 4, wherein the arithmetic circuit comprises an adder.

7. A memory access device comprising:
a memory cell array for storing data, which has memory cells arranged in row and column directions, one of the number of the memory cells of a cell row and that of the memory cells of a cell column is odd;
a first counter connected to the memory cell array for counting clock signal pulses and successively creating row addresses of the memory cell array; and
a second counter connected to the memory cell array for counting the clock signal pulses and successively creating column addresses of the memory cell array;
wherein said first and second counters sequentially diagonally access the memory cell array.

8. The device according to claim 7, wherein the first and second counters are up-counters.

9. The device according to claim 7, wherein the first counter is an up-counter, and the second counter is a down-counter.

10. The device according to claim 7, wherein the first counter is a down-counter, and the second counter is an up-counter.

11. The device according to claim 7, wherein the first and second counters are down-counters.

12. A memory access device comprising:
a memory cell array for storing data, which has memory cells arranged in row and column directions, one of the number of the memory cells of a cell row and that of the memory cells of a cell column is odd;
a first shift register connected to the memory cell array for shifting clock signal pulses and successively creating row addresses of the memory cell array; and
a second shift register connected to the memory cell array for shifting the clock signal pulses and successively creating column addresses of the memory cell array;
wherein said first and second shift registers sequentially diagonally access the memory cell array.

* * * * *